United States Patent [19]
Simpson et al.

[11] Patent Number: 5,923,687
[45] Date of Patent: Jul. 13, 1999

[54] BANDWIDTH ENHANCEMENT AND BROADBAND NOISE REDUCTION IN INJECTION-LOCKED SEMICONDUCTOR LASERS

[75] Inventors: Thomas B. Simpson, San Diego; Jia M. Liu, Los Angeles, both of Calif.; Athanasios Gavrielides, Albquerque, N.M.

[73] Assignee: The United States of America as represented by the Secretary of the Air Force, Washington, D.C.

[21] Appl. No.: 08/903,194

[22] Filed: Jun. 26, 1997

Related U.S. Application Data

[60] Provisional application No. 60/020,860, Jun. 28, 1996.
[51] Int. Cl.$^6$ .................................................. H01S 3/103
[52] U.S. Cl. .................................. 372/18; 372/26; 372/29
[58] Field of Search ............................. 372/9, 18, 26–29, 372/32

[56] References Cited

U.S. PATENT DOCUMENTS

| | | | |
|---|---|---|---|
| 4,556,980 | 12/1985 | Smith et al. | 372/28 |
| 4,635,246 | 1/1987 | Taylor et al. | 372/18 X |
| 4,862,467 | 8/1989 | Carter et al. | 372/18 |
| 4,907,234 | 3/1990 | Goldberg et al. | 372/18 |
| 4,995,047 | 2/1991 | Hadley et al. | 372/50 |
| 5,027,360 | 6/1991 | Nabors et al. | 372/18 |
| 5,063,567 | 11/1991 | Nakajima | 372/28 |
| 5,097,478 | 3/1992 | Verdiell et al. | 372/18 X |

OTHER PUBLICATIONS

Simpson, T. B.; et al., "Small–Signal Analysis of Modulation Characteristics in a Semiconductor Laser Subject to Strong Optical Injection," IEEE, Journal of Quantum Electronics, vol. 32, No. 8, Aug. 1996, 1456–1467.

Simpson, T. B.; et al., "Bandwidth Enhancement and Broadband Noise Reduction in Injection–Locked Semiconductor Lasers," IEEE Photonics Technology Letters, vol. 7, No. 7, Jul. 1995, 709–711.

*Primary Examiner*—John D. Lee
*Attorney, Agent, or Firm*—William G. Auton; Kenneth E. Callahan

[57] ABSTRACT

An injection-locked semiconductor laser process that improves the modulation bandwidth and reduces the broadband noise of an injection-locked semiconductor laser. Injection locking of a semiconductor laser can significantly improve its broadband modulation characteristics. By adjusting the frequency offset between the master laser and the slave laser, improved modulation bandwidth of the modulation response can be emphasized. The intrinsic modulation bandwidths can be enhanced above the theoretical limit for the free-running laser. The improved modulation characteristics are accompanied by reduced broadband relative intensity noise.

8 Claims, 2 Drawing Sheets

MODULATOR CONCEPT

THE 3-dB MODULATION BANDWIDTH AS A FUNCTION OF LASER POWER. P, FOR A HIGH SPEED InGaAs LASER DIODE. THE FREE-RUNNING POINTS ($\Delta$) ARE BASED ON PUBLISHED DATA. THE CALCULATED ENHANCED BANDWIDTH IS SHOWN FOR THREE NORMALIZED INJECTED POWER LEVELS, $P_i/P = 0.09$ (●), 0.36 (♦).

BANDWIDTH ENHANCEMENT AND BROADBAND NOISE REDUCTION IN INJECTION-LOCKED SEMICONDUCTOR LASERS

CROSS-REFERENCE TO RELATED APPLICATION

The present invention includes the subject matter of the Provisional Application Ser. No. 60/020,860 filed on Jun. 28, 1996, the disclosure of which is incorporated herein by reference.

STATEMENT OF GOVERNMENT INTEREST

The invention described herein may be manufactured and used by or for the Government for governmental purposes without the payment of any royalty thereon.

BACKGROUND OF THE INVENTION

The invention relates generally to a process for enhancing the performance capabilities of an injection-locked semiconductor laser. More specifically, it relates to a process which both enhances the bandwidth and reduces the broadband noise intensity of an injection-locked semiconductor laser. The process of the present invention may be used to enhance the performance of any injection-locked semiconductor laser, such as the laser described in U.S. Pat. No. 4,995,047 issued to Hadley et al., the disclosure of which is incorporated herein by reference.

Prior to the invention, injection locking had been used for chirp reduction and for linewidth narrowing. Such techniques improve a semiconductor laser's performance, but do not enhance the modulation bandwidth or reduce the broadband noise intensity of such a laser. A need remains for a process that enhances the modulation bandwidth and broadband noise intensity characteristics of an injection-locked semiconductor laser, and the present invention is intended to satisfy that need.

SUMMARY OF THE INVENTION

The present invention is an injection-locked semiconductor laser process that improves the modulation bandwidth and reduces the broadband noise of an injection-locked semiconductor laser. During this process, a slave laser can receive an electrical signal and then sends an optical signal through optical elements that provide coupling between the slave laser and a master laser, ultimately producing a modulated optical output.

The injection locking technique of the present invention, as described by Simpson et al. in "Small-Signal Analysis of Modulation Characteristics in a Semiconductor Laser Subject to Strong Optical Injection," *IEEE Journal of Quantumn Mechanics*, 32, 1456 (1996) and in "Bandwidth Enhancement and Broadband Noise Reduction in Injection-Locked Semiconductor Lasers," *IEEE Photonics Technology Letters*, 7, 709 (1995), which are incorporated herein by reference, can triple the modulation bandwidth of a semiconductor laser beyond the theoretical limit of a free-running semiconductor laser. These improved modulation characteristics are accompanied by reduced broadband noise intensity. Quite significantly, these advantages can be achieved using constant amplitude injection for a master laser that has very poor high-frequency performance capabilities.

It is an object of the present invention to enhance the modulation bandwidth of an injection-locked semiconductor laser.

It is a further object of the invention to reduce the broadband noise intensity of an injection-locked semiconductor laser.

It is still a further object of the invention to improve digital and analog optical transmission links by enhancing the modulation bandwidth and reducing the broadband noise intensity of an injection-locked semiconductor laser.

It is yet another object of the invention to improve optical control of microwave or millimeterwave systems by enhancing the modulation bandwidth and reducing the broadband noise intensity of an injection-locked semiconductor laser.

These and many other objects and advantages of the present invention will become more readily apparent to one skilled in the pertinent art from the following detailed description when taken in conjunction with the accompanying drawings wherein like elements are given like reference numerals throughout.

DETAILED DESCRIPTION OF THE PREFERRED EMBODIMENT

The semiconductor laser injection locking process of the present invention was developed to improve modulation bandwidth and to reduce broadband relative intensity noise. Although it is established that the laser linewidth and the frequency chirp of a semiconductor laser are significantly improved when the laser is locked to a stable master oscillator, until the present invention, it was unknown that the modulation bandwidth and broadband noise characteristics of such a laser can be improved under injection locking by a strong optical signal.

Figure 1:
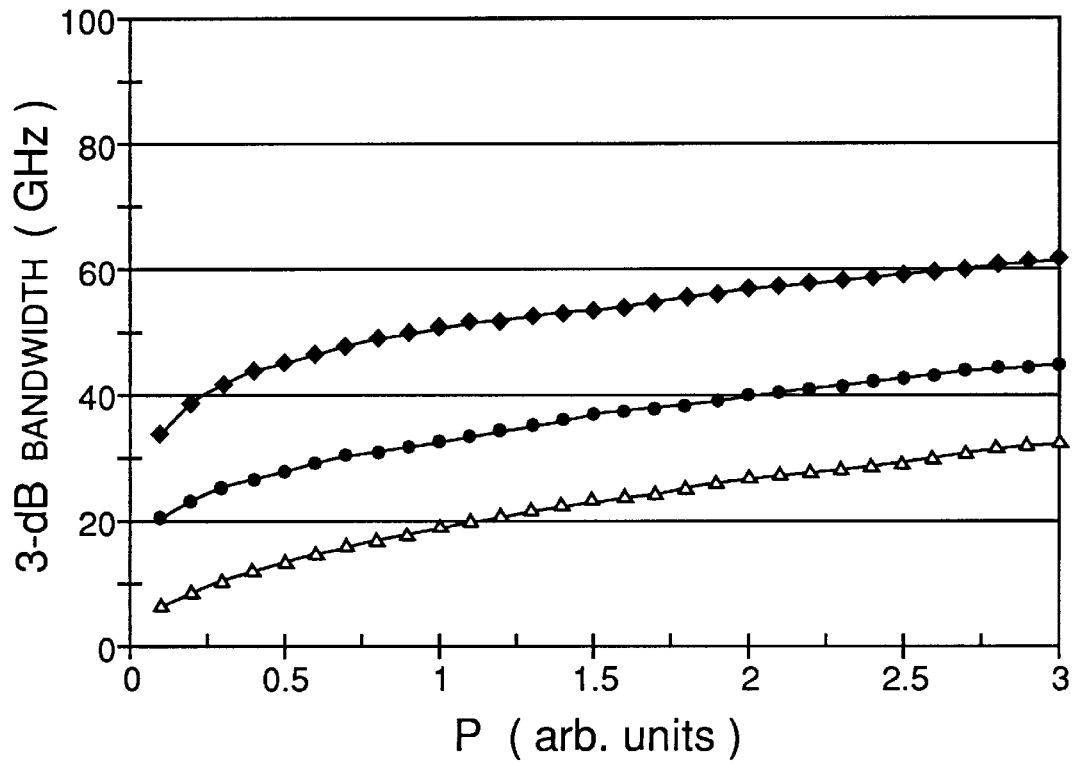
FIG. 1 is a graph illustrating the relationship between modulation bandwidth and laser power from a slave laser for a high speed semiconductor laser diode, where each curve represents a different power level from a master laser.

The reader's attention is now directed to FIG. 1, which shows the enhancement of the modulation bandwidth for a free-running laser diode where a modulation bandwidth of 30 GHz was measured. Such a free-running laser cannot achieve higher bandwidths due to the onset of heating and other damage mechanisms at higher bias currents. With optical injection by a stable master laser, however, the bandwidth is significantly enhanced, and the injection-locked laser diode is capable of operating at a modulation bandwidth of at least 60 GHz.

Figure 2:
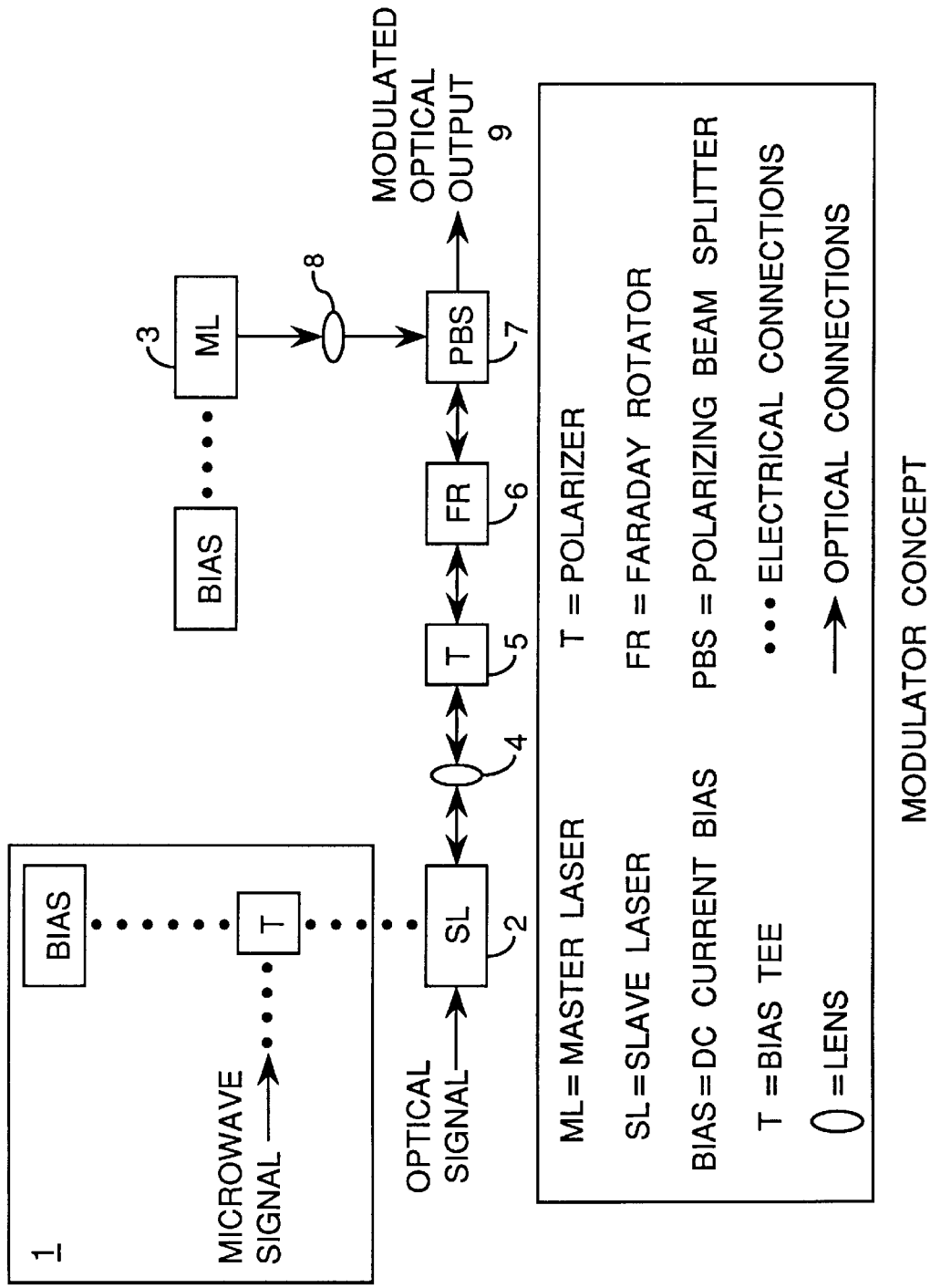
FIG. 2 is a block diagram of the present invention.

The reader's attention is now directed to FIG. 2, which is a block diagram of the modulator elements of this invention. The process of the current invention utilizes a means for receiving a signal 1, a slave laser 2, a master laser 3, and optical elements which provide coupling between the slave laser 2 and the master laser 3. Direct electrical current is received by the master laser 3 by a means for receiving direct electrical current 10. Either an electrical signal or an optical signal can be received by the means for receiving a signal 1.

Although numerous optical elements may be used to couple the slave laser 2 with the master laser 3, in the preferred embodiment, the optical output of the slave laser 2 is directed through a first lens 4, which columnates or focuses the output through a polarizer 5, a faraday rotator 6, and a polarizing beam splitter 7. In addition, in the preferred embodiment, the output from the master laser 3 is directed through a second lens 8, to the polarizing beam splitter 7, and back to the slave laser 2. The polarizer 5, the faraday rotator 6, and the polarizing beam splitter 7 are configured to allow the output from the master laser 3 to be directed to the slave laser 2, while the output from the slave laser 2 is blocked from the master laser 3.

The master laser is a stable, narrow-ban laser oscillator which may have very poor high-frequency modulation characteristics. As previously noted, optical elements reside between the master laser and the slave laser, providing coupling between the lasers and minimizing unwanted feedback into the master laser. Rather than operating simply as a amplifier or as an external modulator, the slave laser operates as an oscillator, so that it can utilize the injection locking bandwidth enhancement.

While the bandwidth enhancement and broadband noise reduction process of the present invention is functioning, an electrical or optical signal is injected into the slave laser through the means for receiving a signal 1. This signal enters the slave laser 2, and an optical signal exits the slave laser 2. In the preferred embodiment, the optical signal which exits the slave laser 2 travels through the first lens 4, through the polarizer 5, through the faraday rotator 6, and into the polarizing beam splitter 7. Simultaneously, an electrical current enters the master laser 3 by way of the means for receiving an electrical current 10, and an optical beam exits the master laser 3, passes through the second lens 8, and enters the polarizing beam splitter 7, where it is directed back to the slave laser 2. After the slave laser 2 receives an electrical signal or optical signal, it produces a modulated optical output 9, and this modulated optical output 9 is passed out of the system through the polarizing beam splitter 7. Such injection locking can significantly enhance bandwidth capabilities of an injection-locked semiconductor laser while reducing its broadband noise intensity. In addition, by adjusting the frequency offset between the slave laser 2 and the master laser 3, improved modulation bandwidth can be further emphasized.

When the modulation bandwidth of the laser is increased, the laser's electron to photon conversion characteristic is modified. The broadband noise intensity of the laser is similarly modified to the electron to photon conversion characteristic.

The process of the present invention can be used to improve digital and analog optical transmission links, such as fiber optic data links. This invention improves modulation bandwidth and, in particular, allows modulation at higher frequencies. When modulation occurs at these higher frequencies, more information can be communicated along the optical beam generated by the slave laser 2. Such an increase in the volume of information that can be communicated over a specific period of time results in an overall increase in the speed in which information can be transmitted. Similarly, by allowing a semiconductor laser to be modulated at frequencies which exceed its normal range, this process can be used to improve optical control of microwave or millimeterwave systems, as it can use the optical beam as a carrier for a microwave or a millimeter wave modulated signal.

While the invention has been described in its presently preferred embodiment, it is understood that the words which have been used are words of description rather than words of limitation, and that changes within the purview of the appended claims may be made without departing from the scope and spirit of the invention in its broader aspects.

What is claimed is:

1. A method of injection locking a semiconductor laser to achieve significantly enhanced modulation bandwidths and reduced broadband noise, comprising the steps of:
    a. supplying a signal to a slave laser, said slave laser being capable of responding to a modulated signal to produce a modulated optical output; and
    b. injection locking said slave laser by injecting the output of a stable master laser by optical means that isolate the optical output of said slave laser from said master laser, said master laser output having a power level sufficient to significantly increase the density of photons in said slave laser and thereby achieving a modulated optical output from said slave laser capable of modulation bandwidths beyond the theoretical limit of said slave laser operated in a free-running mode.

2. The method of claim 1, wherein said signal supplied to the slave laser is a modulated electrical signal.

3. The method of claim 1, wherein said signal supplied to the slave laser is a modulated optical signal.

4. The method of claim 1, wherein said optical means for injecting the master laser output into the slave laser while isolating the slave laser output from the master laser comprises a first lens, a polarizer, a faraday rotator, and a polarizing beam splitter.

5. A system for injection locking a semiconductor laser to achieve enhanced modulation bandwidths and reduced broadband noise, the system comprising:
    a. a slave laser for generating a first optical output;
    b. a means for modulating said first optical output of said slave laser;
    c. a stable master laser for generating a second optical output, said second optical output capable of injection locking said slave laser and having a power level sufficient to significantly increase the density of photons in said slave laser upon injection;
    d. a means for injecting said second optical output into said slave laser while isolating said first optical output from said master laser, thereby enhancing the modulation bandwidth capability and reducing the broadband noise of said first optical output.

6. The system as defined in claim 5, wherein said means for modulating said first optical output further comprises: a bias tee; a means for providing a direct current bias and a modulated current signal to said bias tee; and a means for generating an electrical current from said bias tee into said slave laser.

7. The system as defined in claim 5, wherein said means for modulating said first optical output is a modulated optical signal injected into said slave laser.

8. The system as defined in claim 5, wherein said means for injecting said second optical output into said slave laser comprises: a first lens; a polarizer; a faraday rotator and; a polarizing beam splitter.

* * * * *